United States Patent

Clark

[15] 3,668,762

[45] June 13, 1972

[54] PREPARATION OF ARTWORK MASTERS

[72] Inventor: Alfred Charles Clark, Conduit Lane, Woodham, Mortimer near Maldon, England

[22] Filed: Oct. 13, 1970

[21] Appl. No.: 80,379

[30] Foreign Application Priority Data

Oct. 13, 1969 Great Britain....................50,279/69

[52] U.S. Cl...........................29/203 B, 29/203 P, 29/200 P, 156/251, 156/252, 156/510, 156/513, 156/515

[51] Int. Cl..........................................................H01r

[58] Field of Search..................29/203 B, 203 P, 200 P, 625, 29/628; 156/251, 252, 510, 513, 514, 515

[56] References Cited

UNITED STATES PATENTS 2,753,619 7/1956 Franklin..........................156/251 X
2,970,370 2/1961 Weaver et al....................29/203 B X
2,990,310 6/1961 Chan..............................156/252 X
3,037,265 6/1962 Kollmeier............................29/625
3,307,244 3/1967 De Shong.......................29/203 B X
3,346,950 10/1967 Schick.................................29/625
3,613,232 10/1971 Edwards..............................29/625

*Primary Examiner*—John F. Campbell
*Assistant Examiner*—Victor A. Di Palma
*Attorney*—Christie, Parker & Hale

[57] ABSTRACT

There is provided apparatus and method for the preparation of artwork masters used for the manufacture of printed circuit boards. A grid having uniformly spaced perforations onto which a work sheet for the master is applied is used for proper alignment of pressure sensitive pads on the sheet, the pads being applied by a spiked tool adapted to be centered in and by the perforations and press the pads against the sheet. There is also provided a dispenser and running "conductor" lines between spaced pads on the work sheet.

7 Claims, 8 Drawing Figures

INVENTOR
ALFRED C. CLARK
BY
Christie, Parker, + Hale
ATTORNEYS

PREPARATION OF ARTWORK MASTERS

BACKGROUND OF THE INVENTION

This invention comprises improvements in the preparation of artwork masters, more particularly, although not exclusively, for use in the manufacture of printed circuit boards.

The adoption of double sided and multi-layered printed circuit boards calls for a high degree of accuracy in the production of the artwork masters therefor.

Such artwork masters have to be prepared by hand and hitherto the usual method employed has involved the careful positioning of opaque, stick-on pads at the intersection of grid lines of a rectangular grid marked on a base sheet and the application of narrow, opaque, stick-on strips or tapes extending between the pads. The tapes represent the conductors and the pads represent small rings of conductor forming the connection points to which the components are eventually soldered, the component leads passing through holes defined by the rings.

The positioning of the pads is particularly critical when preparing masters for double sided and multi-layered printed circuit boards because the positions of the holes for the component leads are defined by holes in the centers of the pads and the holes in the pads on opposite sides of a single board or in adjacent multi-layered boards must align.

Apart from the difficulty in positioning the pads with sufficient accuracy at the intersection of grid lines on the base sheet, there is also the difficulty that the grid printed on the base sheet is subject to dimensional inaccuracies beyond an acceptable limit, particularly when the base sheet is a transparent film of plastics material.

SUMMARY OF THE INVENTION

According to the present invention there is provided apparatus and a method for the accurate positioning of pads on a base sheet in the production of printed circuit artwork masters.

The basic apparatus comprising a perforated grid adapted to receive a transparent base sheet onto which the master is to be applied and a spiked tool adapted to penetrate the base sheet and be centered in any one of the perforations of the grid. The spike of the tool is spring biased to permit a pressure sensitive pad carried in the spike to be centered with respect to the perforations and affixed to the base sheet by the pressure of a fixed annular shoulder surrounding the retractable spring biased spike.

In use, a design approximating that of the printed circuit is applied to perforated grid with positions for the pads aligned with the perforations. The base sheet, which is transparent, is applied over the design. At points where circular pads are to be applied to the base sheet, a spiked tool carrying the pad is inserted through the base sheet into an aligned perforation. Upon penetrating the base sheet the spike is centered by the walls of the perforations. As the spike is retracted into the tool by pressure applied against the spring bias, the pad is positioned against and secured to the base sheet.

A narrow pressure sensitive tape which ultimately becomes the conductors of the circuit is applied to the work sheet in connecting relationship to the pads from a dispenser having self contained pressure roller for pressing the narrow tape onto the surface and a pair of rollers for movement of the dispenser over the base sheet and guide, the rollers positioning the dispenser at an acute angle with respect to the base sheet and the guide. The dispenser is dimensioned to align the applied "conductor" lines with the centers of the applied pads.

DRAWINGS

DESCRIPTION

According to the present invention there is provided a system for the accurate preparation of artwork masters to be used for circuit boards and is based on apparatus for the accurate positioning of pressure sensitive pads onto a transparent base sheet on which the artwork master is to be prepared.

Figure 1:
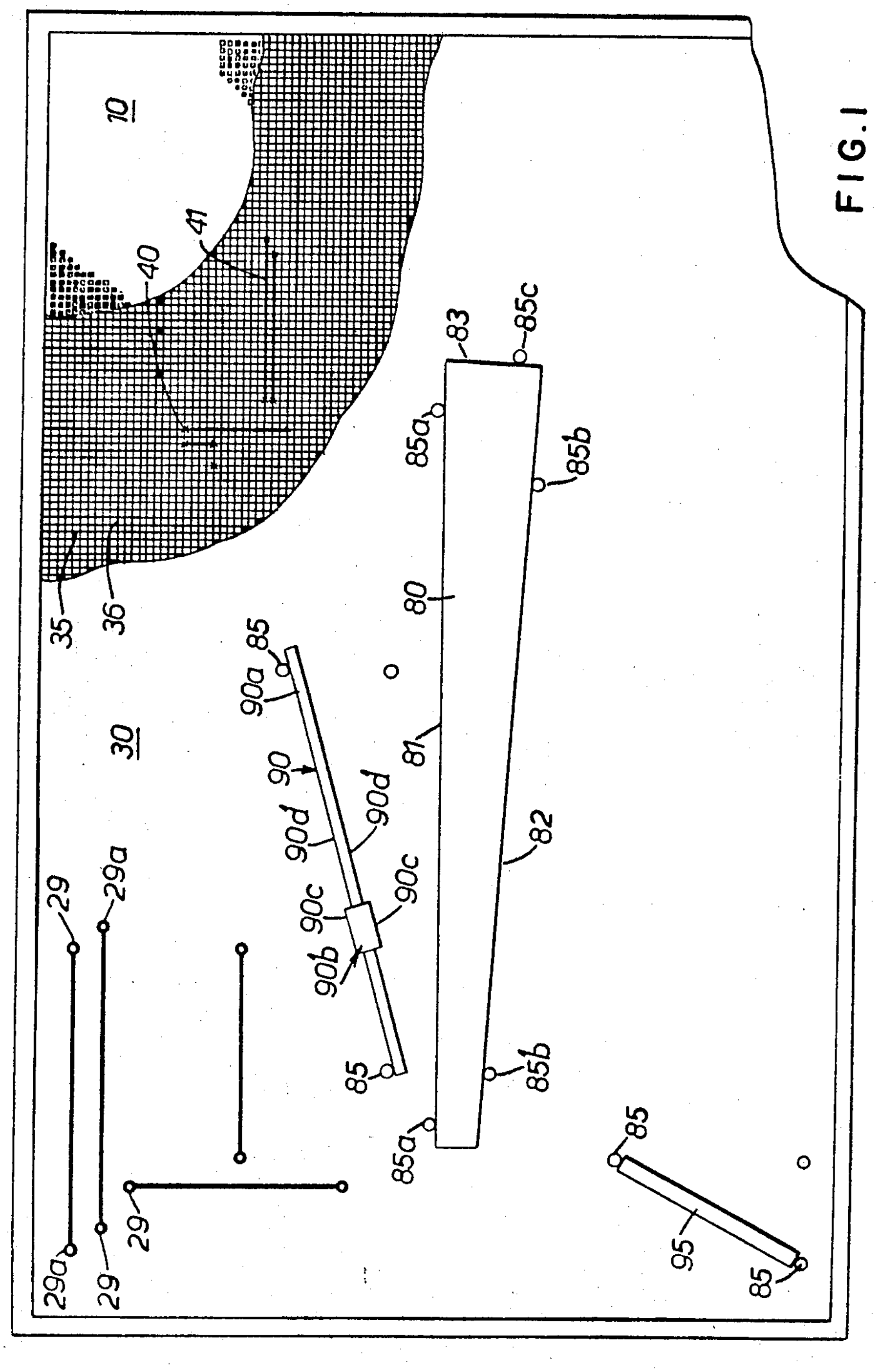
FIG. 1 shows,with a part broken away, part of an apparatus according to the present invention in use in preparing a printed circuit artwork master by a method according to the present invention.

Referring now to the drawings, the apparatus comprises a framed, perforated grid generally indicated at 10 of FIG. 1. The grid is rectangular in outline, and of any convenient size. The construction of the grid is most clearly seen in FIGS. 4 and 5. Thus, the grid comprises a perforated metal plate 11 having an underlying layer of foamed polystyrene 12 sandwiched between the metal plate 11 and a backing board 13 and united therewith by layers 12*a* of impact adhesive, the whole being held in a wooden frame 14.

The perforations 15 in the grid are square in shape and arranged in parallel rows extending in two directions at right angles, the centers of adjacent perforations 15 in each row being spaced 0.1 apart. The perforations 15 are all identical in size.

Figure 2:
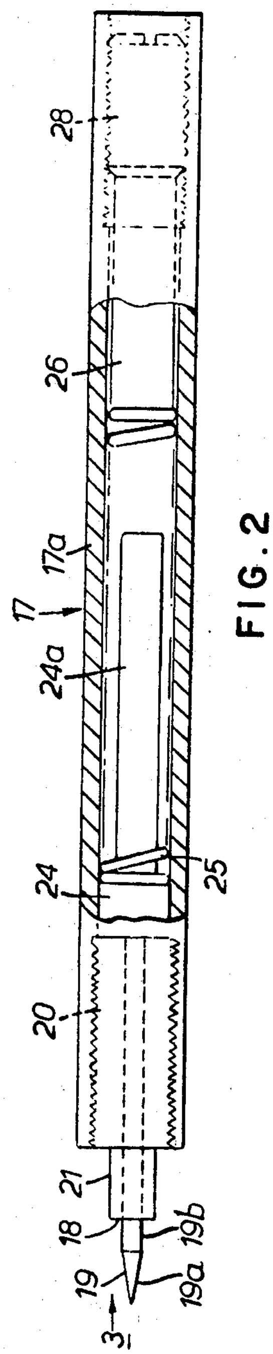
FIG. 2 is a side elevation, in part in section, of a hand tool forming a further part of the apparatus shown in FIG. 1.
Figure 3:
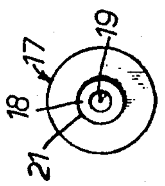
FIG. 3 is a view in the direction of arrow 3 in FIG. 2.
Figure 4:
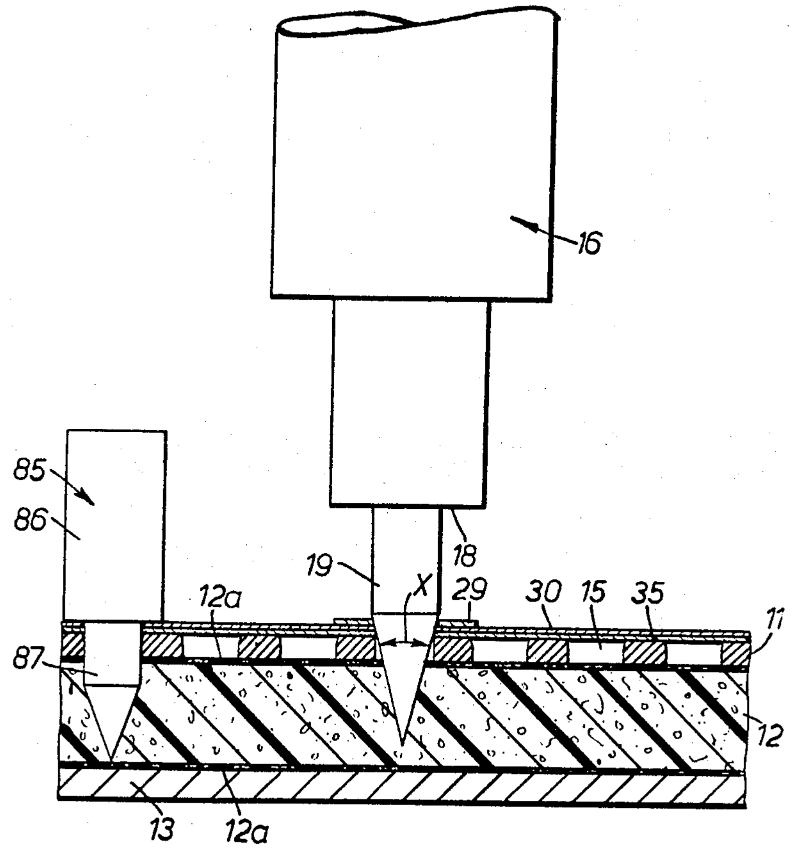
FIG. 4 is a cross-section of the apparatus shown in FIGS. 1,2 and 3 in use in preparing the printed circuit artwork masters.
Figure 5:
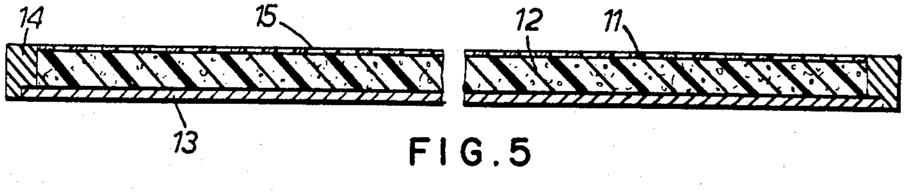
FIG. 5 is a cross-section of part of the apparatus shown in FIG. 1.

The apparatus further comprises a hand tool generally indicated at 16 in FIG. 4 and constructed as most clearly shown in FIGS. 2 and 3. Thus the hand tool comprises a body part or handle 17 having at one end an annular shoulder 18 through which projects a retractable spike 19. The body part comprises a cylindrical tube 17*a* having a threaded plug screwed into it from each end. The plug 20 at the end adjacent the spike 19 has a reduced diameter cylindrical portion 21 projecting from the tube and presenting the shoulder 18 as its end face. The plug 20 has an axial bore of uniform circular cross-section which slidably receives the spike 19, the spike being a sliding fit in the bore.

The spike is formed with an enlarged diameter intermediate portion 24 which is a sliding fit in the tube 17*a* and an inner end portion 24*a* of a lesser diameter than the portion 24 which mounts an open coiled compression spring 25. The spring 25 is engaged between the portion 24 and a cylindrical member 26 in the bore of the tube 17*a*, the member 26 abutting the other plug 28. Normally, the spring 25 holds the portion 24 against the plug 20 as shown in FIG. 2 whereby the spike 19 is held in its projected position.

The spike is retractable into the body part of the tool against the action of the spring 25.

The free end 19*a* of the spike is of right conical form, tapering to a sharp point. Adjacent its free end, as at 19*b*, the spike is of cylindrical form and of a diameter slightly greater than that of the holes 29*a* in the pads 29 which are to be applied to a base sheet 30 in the construction of a printed circuit artwork master by the method according to the present invention, using the apparatus so far described, and that method will now be described.

A layout of the required circuit is drawn on a transparent drawing sheet 35 of plastics film material of predetermined thickness printed with a rectangular grid of lines 36 intersecting at right angles. Such material is commercially available. A film of polyethylene Terephthalate 0.003 inch thick and having one matt surface is particularly suitable.

The layout is prepared on the matt surface of the film using ordinary drawing board techniques and no particular accuracy is required, the draftsman who designs the layout simply marking the required positions of the pads at the intersections of grid lines 36 which are spaced by 0.1 inch to correspond with the spacing of the centers of the perforations 15 of the perforated grid and drawing in the conductor paths with a T-square or a T-square and a set square. This is illustrated in FIG. 1 where pad positions are shown marked on the layout by crosses 40 and conductors by lines 41. The illustrated markings 40 and 41 have purposely been made very simple. A normal layout will usually comprise a far more extensive network of conductor indicating lines and pad positions.

The layout is placed on the perforated grid surface with the crosses 40 roughly aligning each with the center of a perforation 15, and the layout is secured to the grid along all four edges with adhesive tape.

The base sheet 30 which is of predetermined thickness and preferably a further transparent plastics film of polyethylene Terephthalate 0.005 inch thick, is then placed on top of the layout and secured to the grid with adhesive tape along all four edges.

Holes are then punched in the base sheet 30 at all the required pad positions 40 using the hand tool previously described. The hand tool is used normal to the surface of the grid, and the spike of the tool is pushed home in the respective perforations 15 underlying the crosses marking the pad positions until the spring 25 holding the spike in its projected position is felt to yield.

The conical free end portion 19*a* of the spike has a maximum diameter greater than the length of the sides of the perforations 15. The conical portion of the spike accordingly engages the sides of each perforation into which the spike is pushed, whereby the spike is automatically centered in the perforation and likewise the hole formed by the spike in the base sheet 30.

Following this, a pad 29 is applied to the base sheet so as to surround each hole, again using the hand tool.

A supply of the pads which are coated with a layer of pressure sensitive adhesive on one side may be provided removably attached to a strip of other material as described for example, in the specification of British Pat. No. 959,861.

In order to apply a pad 29 to the base sheet around a hole therein, the pad is picked up on the spike 19 with its adhesive coated side facing the point of the spike. Since the hole in the pad is of a diameter less than the maximum diameter of the conical free end portion 19*a* of the spike, the pad is retained on that portion.

It is important that the pad be positioned on the portion 19*a* beforehand such that when the spike is pushed home in the perforation in which the hole is centered, the adhesive coated side of the pad is just brought flush with the surface of the base sheet 30 as shown in FIG. 4. To this end, the axial length of that part of the conical free end portion 19*a* of the spike which projects above the surface of the grid when the spike is pushed home in each perforation so as to be centered therein as above described, is made greater than the sum of the thicknesses of the pad, the base sheet and the layout sheet, and the cone angle of the portion 19*a* is so chosen that a pad having a hole of a predetermined diameter will assume the correct position on the portion 19*a* when it is pushed on to the portion 19*a* until the portion 19*a* just fills the hole in the pad. Thus positioned, the hole in the pad, and therefore, the pad itself, is centered with respect to the spike so that when the spike carrying the pad is pushed home in the perforation in which the hole is centered, the hole in the pad is centered with respect to the hole. Also, because the pad is then brought flush with the surface of the base sheet, it cannot move out of its correct position on the base sheet.

Additional downward force is exerted on the hand tool after the pad has been positioned on the surface of the base sheet to cause the shoulder 18 to advance towards, and engage, the upper side of the pad and press the pad firmly against the base sheet to cause it to adhere thereto.

If the cone angle is $x$, then the tangent of one half the cone angle should be equal to the radius of the hole in the pad divided by the sum of the thicknesses of the pad, the base sheet and the layout sheet.

In order to position each pad correctly on the spike 19 before the pad is applied to the base sheet, a small section of the grid 10 may be provided covered with a sheet material layer of a thickness equal to the combined thickness of the base sheet and the layout sheet and having a release coating on its upper surface.

Each pad is then picked up on the spike of the hand tool and the spike inserted into a perforation of this specially prepared section of the grid and pushed home therein with the result that the pad is pushed up the conical free end portion 19*a* of the spike and centered thereon as required. At the same time it is prevented by the release coating from becoming attached to the sheet material covering the specially prepared section of the grid.

Instead of having a specially prepared section of the grid 10 for this purpose, a separate, specially prepared grid may be provided for example, in conjunction with a dispenser for strip material carrying a supply of the pads.

When pads have been applied to all the holes formed in the base sheet, the stick-on tapes are next applied over the lines 41.

The tapes, like the pads, have a layer of pressure sensitive adhesive on one side.

The tapes may be applied using a dispenser or so-called "-tape pen" as described in the specification of British Pat. No. 862,706 and with the assistance of a "straight-edge" member to guide the pen as also described in that specification.

However, the apparatus of the present invention includes certain modifications to the dispenser described in the above-mentioned specification with a view to improving the accuracy of the dispenser.

As described in the specification of British Pat. No. 862,706, a dispenser for dispensing adhesive tape from a roll of tape comprises a pair of flat, spaced, substantially circular cover plates adapted to confine between them a roll of adhesive tape, one of said plates having protruding at its inside a centrally located circular spindle, of which the circumference is adapted to engage the inner diameter of the roll of tape; fastening means to hold the plates together with the roll of tape between them; a set of rollers confined between extended portions of the cover plates so that the tape to be dispensed may be fed between the rollers, one of the rollers protruding partially from the cover plates and serving as a pressure roller for pressing the tape on to the surface to which it is to be affixed; and a supporting leg extending outwardly from one of the cover plates and adapted rest, when dispensing tape, on the surface to which the tape is to be affixed thereby causing said dispenser, when supported on said pressure roller, said leg and on a portion of said spaced apart cover plates, to dispense tape with the width thereof in a plane parallel to the plane of the surface to which the tape is to be affixed.

According to the present invention, the dispenser as just defined, is modified in that it is provided with a second supporting leg extending outwardly from the other cover plate and adapted to rest, when dispensing tape, on a "straight-edge" along which the dispenser is to be guided by one of its cover plates to dispense the tape, said dispenser when supported on said pressure roller and said supporting legs being inclined at an acute angle with respect to the surface to which the tape is to be affixed, said pressure roller having a peripheral surface which is correspondingly inclined with respect to the axis of the roller so as to lead one edge of the tape against a guide surface fixed in its position with respect to said cover plates.

Figure 6:
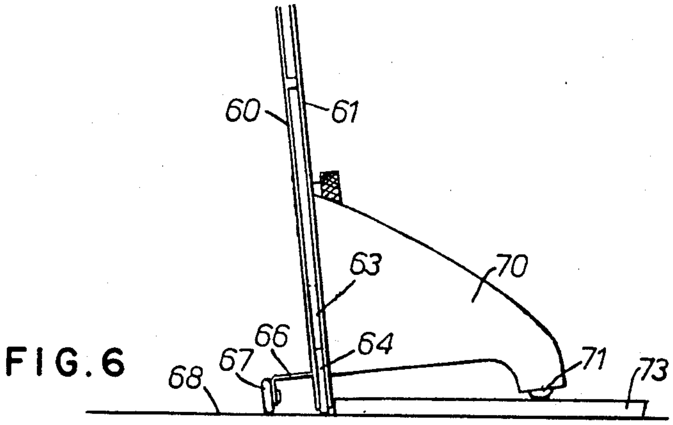
FIGS. 6,7 and 8 show further apparatus according to this invention.
Figure 7:
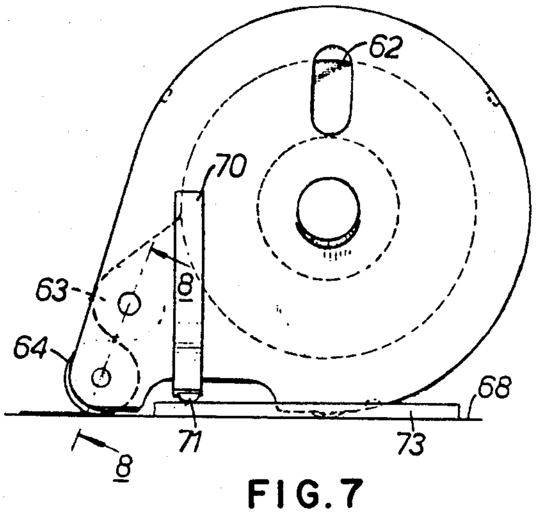
Figure 8:
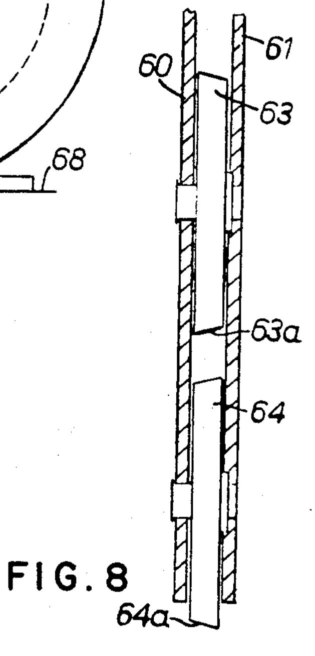

Referring to FIGS. 6,7 and 8, the cover plates are indicated at 60 and 61 respectively, and the roll of adhesive tape is indicated at 62. The set of rollers is indicated at 63 and 64, the roller 64 constituting the pressure roller. The supporting leg which is adapted to rest on the surface to which the tape is to be affixed is indicated at 66 and is provided with a roller 67 to run on that surface which is indicated at 68. The leg 66 extends outwardly from the cover plate 60. A second support leg 70 extends outwardly from the other cover plate 61 and is provided with a rollable ball 71 to engage and run on the top surface of a "straight-edge" 73 along which the dispenser is to be guided by its cover plate 61.

As may be seen in FIG. 6, the dispenser is inclined at an acute angle to the surface 68 when supported on the pressure roller 64 and the legs 66 and 70 and, in this example, so as to make an obtuse angle with the top surface of the "straight-edge" 73.

In order that the dispenser shall dispense the tape in a plane parallel to the plane of the surface 68 with the dispenser in its inclined position, the pressure roller 64 has a peripheral surface 64*a* which is correspondingly inclined with respect to the axis of the roller so as to run flat on the surface 68 when the dispenser is moved along the "straight-edge" 73.

The inclined peripheral surface of the pressure roller 64 leads one edge of the tape against the inside surface of the cover plate 60.

Since the cover plate 61 engages the straight edge and the cover plates 60 and 61 are secured together in a fixed spatial relation as described in the specification of British Pat. No. 862,706, the tape is thus dispensed with one edge of the tape always at a fixed distance with respect to the straight edge and the accuracy is improved.

To counteract the twisting of the tape as it runs around the roller 64 and to ensure that the tape is evenly tensioned across its width as it is dispensed onto the surface 68, the roller 63 is likewise provided with a peripheral surface 63*a* which is again corresponding inclined with respect to the axis of the roller but in the opposite direction to that in which the surface of the roller 64 is inclined.

The dispenser shown in FIGS. 6,7 and 8 is otherwise constructed as described in the specification of British Pat. No. 862,706.

In order that the straight edge 73 may itself be accurately positioned to guide the tape dispenser, use may be made of the grid 10 and pins inserted into perforations 15 of the grid to provide reference points for positioning the "straight-edge."

Additionally, a measuring means and method is provided in accordance with the present invention by the use of a "-straight-edge" having further edges of predetermined gradient relative to the straight-edge along which tape is to be dispensed, in conjunction with the grid and pins positioned in the grid at predetermined points with respect to reference points marked on the grid by other pins and defining a straight-edge position from which the straight-edge is to be moved to a parallel position by a predetermined amount.

Thus, the straight edge may be advanced in predetermined increments from an initial position to guide the positioning of successive ones of a plurality of parallel tapes.

According to the present invention, such measuring means comprises a perforated grid adapted to support a base sheet on which an artwork master is to be prepared and a "straight-edge" member presenting at least one pair of opposite, non-parallel edges and preferably at least one further edge transverse to said opposite non-parallel edges and making an angle other than a right angle with respect to each of them.

A method of measuring, according to the present invention using apparatus as defined in the immediately preceding paragraph involves positioning the "straight-edge" member on the grid so that one of said opposite non-parallel edges extends parallel with the rows of perforations extending in one direction across the grid, fixing reference points on the other of said non-parallel edges with respect to the grid and then displacing the straight-edge member to move said reference points along said other of said non-parallel edges by a predetermined amount with respect to said grid, and by reference to said grid, thereby to displace said one of said non-parallel edges normal to said rows of perforations extending in said one direction by a predetermined amount which is a fraction of the first said predetermined amount.

Referring to FIGS. 1 to 4, the measuring means uses the grid 10 already described and additionally a "straight-edge" member 80 of plate form having a first pair of opposite non-parallel edges 81 and 82 and a further edge 83 transverse to the edges 81 and 82 and making an angle other than a right angle with respect to each of the edges 81 and 82.

The edge 82 has a gradient of 10 to 1 with respect to the edge 81, such that lines drawn normal to the edge 81 and spaced 1 inch apart have a length between their points of intersection with the edges 81 and 82 which differ by 0.1 inch.

The edge 83 has a gradient of 10 to 1 with respect to a line drawn normal to the edge 81 such that lines drawn parallel with the edge 81 and spaced 1 inch apart have a length between their points of intersection with the edge 83 and a line normal to the edge 81 which differ by 0.1 inch.

In order to position the "straight-edge" member 80 pins 85 (see FIG. 4) having cylindrical heads 86 and pointed, cylindrical shanks 87 are provided. The cylindrical shanks have a diameter equal to the length of the sides of the perforations 15 in the grid. When one of these pins is positioned in the grid, therefore, the long axis of the pin passes through the center of the perforation in which the pin is inserted. The spacing between the axes of any two pins positioned in the grid is, therefore, determinable by reference to the grid. The heads of the pins are all of the same predetermined diameter, in the present example 0.2 inch. The spacing between the respective peripheral surfaces of any two pins positioned in the grid is, therefore, likewise determinable by reference to the grid.

A pair of pins 85*a* (see FIG. 1) positioned in perforations in the same horizontal row of perforations of the grid provide reference points for positioning the edge 81 in a starting position.

The tape dispenser is dimensioned to lay a tape with the center line of the tape extending along a straight line extending through the centers of pads applied to the base sheet and centered on perforations in the same row as the pins 85*a*.

With the edge 81 so positioned, two further pins 85*b* may be positioned in perforations of the grid so that their heads are touching the edge 82. These pins fix reference points on the edge 82 where their heads engage that edge with respect to the grid.

If now a still further pin 85*c*, positioned in a perforation of the grid so that its head touches the edge 83, is moved a preselected number of perforations in a direction parallel with the edge 81 and the "straight-edge" member is moved, after having removed the pins 85*a*, with its edge 82 in contact with the pins 85*b* so that the edge 83 again lies against the head of the pin 85*c*, thereby effectively moving along the edge 82, the reference points on the edge 82 fixed with respect to the grid by the pins 85*b*, the edge 81 is displaced normal to the row of perforations which contained the pins 85*a* by one tenth of the amount the pin 85*c* was moved.

Correspondingly, if the pin is moved a preselected number of perforations in a direction normal to the edge 81 and the straight edged member is moved with its edge 82 in contact with the pins 85*b* so that the edge 83 again lies against the edge of the pin 85*c*, the edge 81 is displaced normal to the row of perforations which contained the pins 85*a* by one hundredth of the amount the pin 85*c* was removed.

The spacing of parallel tapes to an accuracy of 0.001 may thus be achieved.

The edge 81 may also be moved to parallel positions in multiples of 0.1 inch by moving each of the pins 85*b* a predetermined number of perforations in a direction normal to the edge 81.

By positioning the pins 85*a* in a row of perforations extending vertically of the grid, tapes may also be laid vertically in the manner described.

It will be appreciated that the grid 10 and the pins 85 as described provide an accurate means of constructing any artwork master from a rough layout or in some circumstances, they may be used to construct some parts of an artwork master directly.

The grid and pins may be used directly to position a "-straight-edge" along which a tape dispenser may be guided or to position a special ruler for drawing lines between the centers of pairs of the pins and along which a tape may be applied in any convenient way.

Such a ruler is indicated at 90 in FIG. 1 and comprises a straight bar 90*a* carrying a saddle 90*b* which is slidable on the bar. The saddle has an opposite pair of parallel edges 90*c* parallel with the long straight edges 90*d* of the bar and each spaced from the adjacent parallel edge of the bar by 0.1 inch. When the bar is positioned against a pair of pins 85 as shown in FIG. 1, one of the edges 90*c* lies along a line connecting the centers of the two pins and by sliding the saddle along the bar, the saddle may be used to guide a pencil between the pins 85 in order to draw such a line.

By reducing the tangent of an angle to a vulgar fraction correct to the required number of decimal places, pins 85 may be set up on the grid to mark the corners of a triangle including such an angle and the angle thus constructed to the required accuracy.

It will be understood that the grid has to be produced to a high degree of accuracy, and must be dimensionally stable and not subject to rapid wear. To this end, the metal plate is preferably formed by electro deposition of nickel to form directly a perforated nickel plate.

A bar 95 (see FIG. 1) of predetermined length may be provided for checking the distance between pins 85 positioned horizontally, vertically or diagonally on any part of the grid to check the dimensional accuracy of the grid. A bar 9.8 inches long should fit exactly between two pins spaced respectively by 36 and 64 holes in the horizontal and vertical directions. This in effect involves the construction of a 3,4,5 triangle to give a hypotenuse of 10 inches, the pins of course, making up the 9.8 inches length of the bar to this dimension.

The holes punched in the layout sheet and the artwork master by the hand tool serve for re-positioning them on the grid for correction or modification. It is found that when using a film of plastics material the peripheral edge of each hole is depressed slightly and forms a pimple on the underside of the film. These pimples on the master and layout sheet may be fitted into one another and the pimples on the layout sheet into the perforations of the grid in order to reposition the layout sheet and master on the grid. In the same way the layout sheet and the master may be turned through 90° on the grid to facilitate the composition of the master if desired.

The pads may be of any desired outside diameter.

If pads having a different diameter holes are required to be employed then a hand tool as described having a spike dimensioned to suit each particular pad hole diameter must be used.

For the purpose of this specification "grid" is defined to mean reference points uniformly spaced and arranged in parallel rows extending in two directions at right angles.

A "perforated grid" is defined to mean a grid in which the reference points are defined each at the center of a hole in the grid.

The holes may be of any desired shape which defines a center.

What is Claimed is:

1. Apparatus for use in the accurate positioning of annular pads on a base sheet in the production of printed circuit artwork masters which comprises:

a. a pad applicator comprising a shaft retained in slidable relation by a housing, said shaft having a tapered pointed end and projecting from said housing and adapted to penetrate said base sheet and further adapted to receive and retain an annular pad, said housing providing means surrounding said shaft for pressing an annular pad against the base sheet; and b. a perforated grid adapted to receive said base sheet in overlying relation, the perforations of said grid adapted to receive and center the tapered end of said shaft.

2. Apparatus as claimed in claim 1 in which the perforations of the grid center the tapered end of said shaft when an annular pad contained on the taper of said shaft is flush with the base sheet.

3. Apparatus as claimed in claim 1 in which the shaft is spring biased within said housing.

4. Apparatus as claimed in claim 3 in which the tapered end of said shaft is of right conical form.

5. Apparatus as claimed in claim 1 in which the perforated grid is supported by a backing adapted to receive the tapered end of said shaft.

6. Apparatus as claimed in claim 5 in which the backing is a foamed plastic.

7. Apparatus as claimed in claim 5 in which the thickness of the foamed plastic backing exceeds the axial length of the tapered portion of the shaft and is contained between the perforated grid and a backing board.

* * * * *